United States Patent [19]
Waggener

[11] 3,969,705
[45] July 13, 1976

[54] SPECTRUM ANALYZER HAVING MEANS FOR TRANSIENT SIGNAL ANALYSIS

[75] Inventor: William N. Waggener, Sarasota, Fla.

[73] Assignee: Weston Instruments, Inc., Newark, N.J.

[22] Filed: June 10, 1974

[21] Appl. No.: 477,825

[52] U.S. Cl. .......................... 340/173 RC; 340/353; 179/15.55 T
[51] Int. Cl.² ........................................ G11C 21/00
[58] Field of Search ................ 340/173 R, 173 RC; 340/353; 179/15.55 T

[56] References Cited
UNITED STATES PATENTS
3,504,352  3/1970  Stromswold ................. 179/15.55 T Primary Examiner—Terrell W. Fears
Attorney, Agent, or Firm—William R. Sherman; Kevin McMahon; Ivan S. Kavrukov

[57] ABSTRACT

A spectrum analyzer including a device for analyzing signals whose time duration is short as compared to the normal sampling rate of the spectrum analyzer. A transient signal, or a small portion of any analog signal, is sampled at a sampling rate which is substantially higher than the normal sampling rate of the spectrum analyzer, and the samples are stored in analog form in a storage device such as a charge coupled device acting as an analog delay line. The stores analog samples are then read out at the normal sampling rate of the spectrum analyzer, to form a longer duration signal which can be analyzed by the spectrum analyzer in a conventional manner.

11 Claims, 2 Drawing Figures

SPECTRUM ANALYZER HAVING MEANS FOR TRANSIENT SIGNAL ANALYSIS

BACKGROUND OF THE INVENTION

The invention is in the field of spectrum analyzers and specifically relates to a device for analyzing fast signals, e.g. signals of transient nature, whose time duration is short as compared to the normal sampling rate of a spectrum analyzer, and also relates to devices for capturing and time-stretching signals of a very short duration.

There are many circumstances in which it is desired to analyze a signal of a transient nature, that is, a signal which occurs perhaps only once, and for a brief period of time. Closely related are the problems of analyzing a short time duration signal which may occur periodically, but with a relatively long time duration between occurrences, and of analyzing a very short portion of any signal. In analyzing signals of this type, not only is the wave shape of the signal important, but frequently information about the frequency content of the signal is desirable. If the signal is of very short duration, the problem of acquiring and performing measurements of it is difficult. One prior art approach has been to digitize the signal and to store the digital information. The signal can then be repeatedly examined, and further processing can be performed on it at a slower rate. However, this requires a very high digitizing rate, and this is expensive for signals of very short duration, and may even be impossible for extremely short signals. Another prior art approach uses devices such as storage oscilloscopes to record and hold the fast signal. However, this has the disadvantage that the signal is merely stored on the CRT face and can not be further processed except by manual translation of the stored image into numerical information. Such manual translation is expensive, and subject to human error. It is desirable therefore to provide for acquiring a signal whose time duration may be very short, and for analyzing the acquired signal in a manner which is efficient, error-free and relatively inexpensive.

SUMMARY OF THE INVENTION

The invention is in the field of analyzing short duration signals and relates specifically to methods and means for acquiring a short duration signal and for analyzing the acquired signal.

A short duration signal, such as a fast transient, is sampled at a sampling rate which is much higher than the normal sampling rate of a spectrum analyzer, and the resulting sequence of analog samples is stored in an analog storage device such as a charge transfer device serving as an analog delay line. The analog storage device is then read out at the normal sampling rate of a spectrum analyzer, and its output is applied to the normal signal input of the spectrum analyzer. The invention, when combined with a suitable prior art spectrum analyzer, allows the analyzer to examine signals whose duration is too short for the normal capability of the analyzer, so that a transient signal or a small portion of a periodic signal or other signal can be captured and processed in any of the normal modes of a conventional, relatively inexpensive spectrum analyzer.

In a specific embodiment of the invention, a transient signal analyzer in accordance with the invention is combined with a spectrum analyzer which conventionally analyzes an input signal by sampling it at a selected first sampling rate and providing an indication of the frequency content of the sampled signal. The invented transient signal analyzer samples a fast analog signal at a second sampling rate which is substantially higher than the first sampling rate to provide a succession of fast analog samples, stores these fast analog samples, and then reads the stored fast analog samples at a rate which is of the order of magnitude of the first sampling rate, and applies them at that rate as an input signal to the spectrum analyzer. The second sampling rate is at least four times, and typically at least an order of magnitude, higher than the first rate. This second sampling rate may be of the order of tens of megacycles or even higher, depending on the capacity of the means for storing the fast analog samples. With this arrangement, fast analog signals whose duration is as short as 5 microseconds can be analyzed when the second sampling rate is up to 100 MHz.

DETAILED DESCRIPTION

Figure 1:
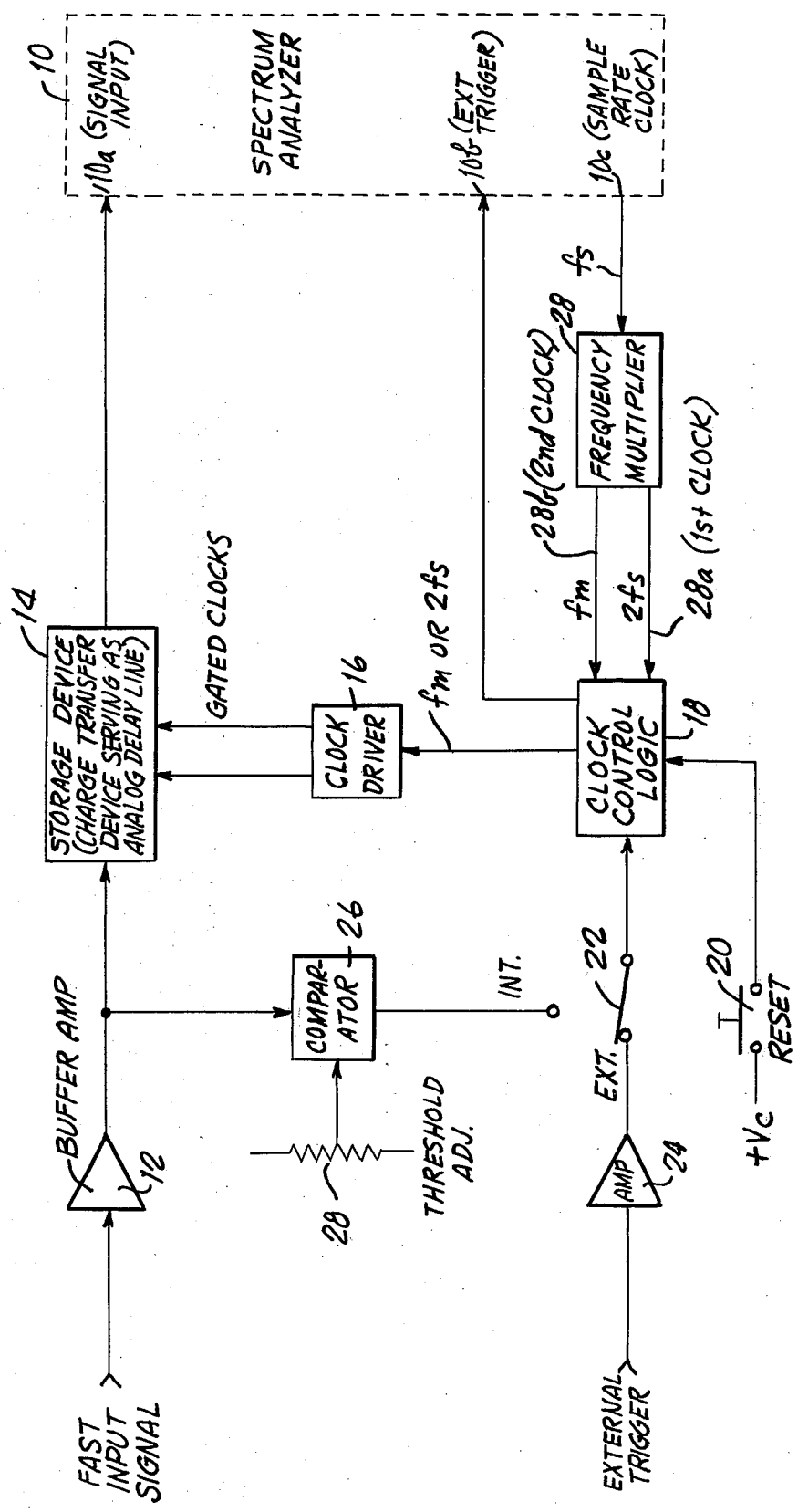
FIG. 1 is a generalized block diagram of a transient signal analyzer embodying the invention, combined with a prior art spectrum analyzer.

Referring to FIG. 1, a spectrum analyzer, 10, which may be the Schlumberger-EMR Spectrum Analyzer known as Model 1510, has a signal input point 10a which receives an input signal for analysis, a trigger input point 10b at which the spectrum analyzer 10 can be externally triggered and a point 10c at which the sample rate clock of the spectrum analyzer is tapped. When triggered at point 10b, the spectrum analyzer 10 samples the signal at its input point 10a at the selected rate of its sample rate clock, which is the same as the rate at output point 10c. Spectrum analyzer 10 may operate in a number of modes, to provide different information about the frequency content of the signal at its input point 10a. An example of a spectrum analyzer of this type is described in U.S. patent application Ser. No. 360,098 filed in May 14, 1974, now U.S. Pat. No. 3,881,097, which is hereby incorporated by reference.

A fast input signal, which may be derived, for example, by tapping a high frequency line of a radar set, is suitably amplified at a buffer amplifier 12, and the output of buffer amplifier 12 is applied to a storage device 14, which may be a charge transfer device (also called charge coupled device) serving as an analog delay line. The input to storage device 14 from buffer amplifier 12 is gated into device 14 by clock driver 16 under the control of clock control logic 18. Clock control logic 18 is reset by switch 20, and is triggered through switch 22 either by an external trigger signal suitably amplified at 24, or by an internal trigger signal provided by comparator 26, which compares the output of buffer amplifier 12 and the output of a threshold adjuster 28 and triggers control logic 18 through switch 22 only when the output of buffer amplifier 12 equals the level of the threshold signal from threshold adjuster 28. Clock control logic 18 receives from a frequency multiplier 28 a first clock over a line 28a and a second clock over a line 28b, the first clock being at a first rate which is of the order of magnitude of the sample rate clock $f_s$ of spectrum analyzer 10 and synchronized therewith, e.g. at $2f_s$, and the second clock being at a substantially higher frequency $f_m$. Frequency multiplier 28 receives the sample rate clock $f_s$ of analyzer 10 from point 10c. Clock control logic 18 also has a trigger output applied to trigger input point 10b of spectrum analyzer 10.

In operation, clock driver 16 clocks fast analog samples of the fast signal from buffer amplifier 12 into storage device 14 at a rate determined by the higher sampling rate $f_m$ present on line 28b. When storage 14 is a charge coupled device, fast analog samples are clocked into it at the rate $f_m/2$, because two clock pulses are needed to enter one sample into a charge coupled device. When a sufficient number of analog samples of the fast signal have been stored in storage device 14, clock control logic 18 (which counts the number of the higher rate sample clock pulses on line 28b) stops clocking analog samples into storage device 14. Then, clock control logic 18 externally triggers spectrum analyzer 10 at point 10b, and starts clocking analog samples out of storage device 14 and into signal input 10a of spectrum analyzer 10 using the lower rate clock $2f_s$ at line 28a. Since the clock $2f_s$ is at twice the sampling rate $f_s$ of spectrum analyzer 10, and since two clock pulses are needed to shift a fast analog sample out of a charge transfer device, the output of storage device 14 is fast analog samples at the normal sampling rate $f_s$ of spectrum analyzer 10. Further, since clock $2f_s$ is coherent with the sampling rate $f_s$ of spectrum analyzer 10, the output of storage 14 is in proper sync with spectrum analyzer 10. Spectrum analyzer 10 is thus able to analyze fast signals from buffer amplifier 12 which it could not analyze at its normal sample rate clock, and it can do that without modifications in its internal circuitry, without the need for digitizing the fast signal at a high sampling frequency, and without using a special purpose spectrum analyzer.

Figure 2:
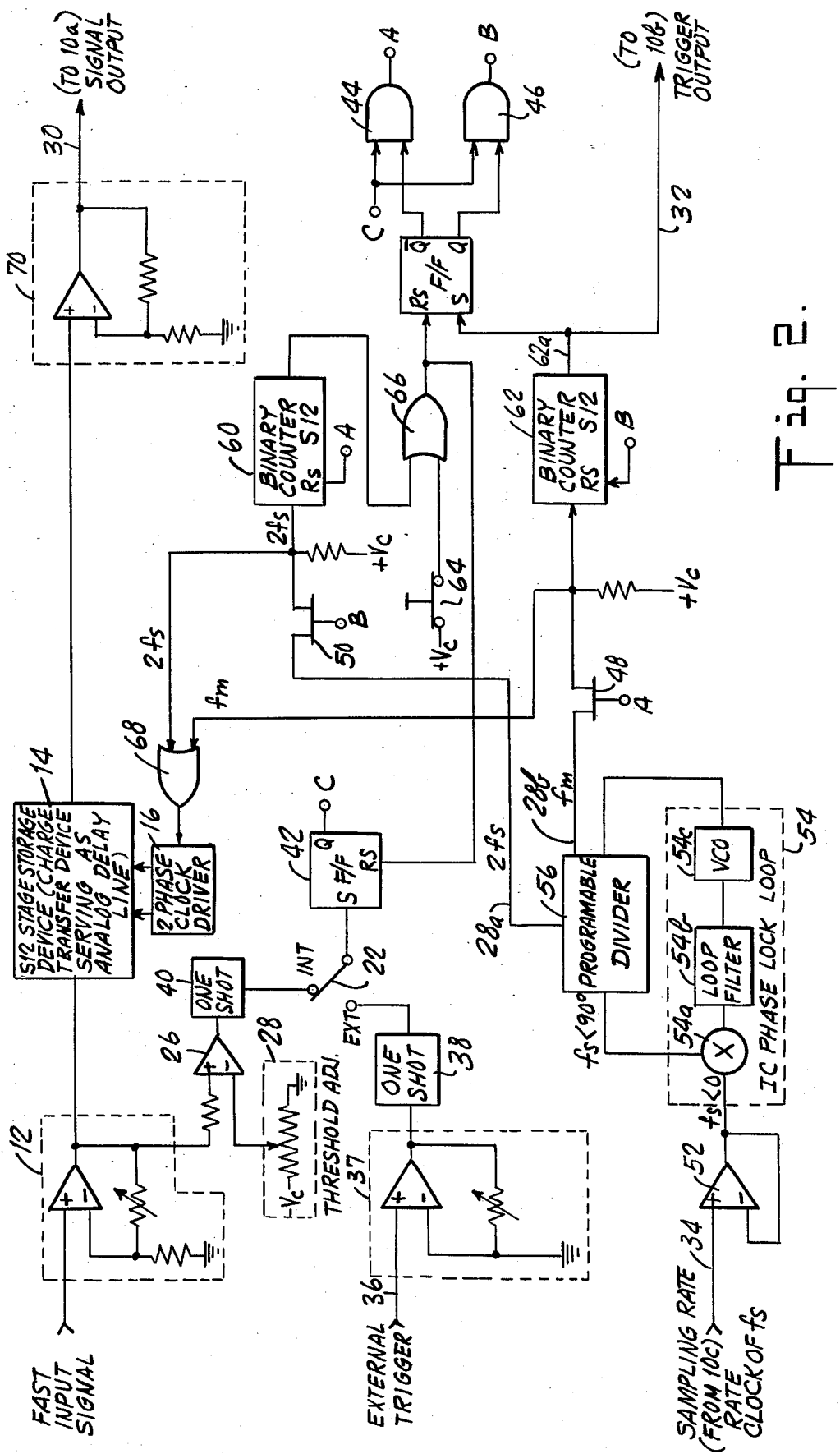
FIG. 2 is a detailed diagram of a transient signal analyzer circuit embodying the invention.

Referring to FIG. 2 for a detailed showing of a transient analyzer circuit implementing the invention, line 30 is for connnection to point 10a of spectrum analyzer 10, line 32 is for connection to point 10b of spectrum analyzer 10, and line 34 is for connection to point 10c of spectrum analyzer 10 of FIG. 1. Referring to FIG. 2, the transient analyzer can be triggered either externally, by a trigger pulse over line 36 which sets a one-shot 38 through a threshold amplifier 37, or internally, by setting a one-shot 40 through threshold amplifier 26 when the output of buffer amplifier 12 equals the level determined by threshold adjuster 28. The triggering mode is selected by switch 22, which may be manual. The clean trigger signal from either of one-shots 38 and 40, depending on the position of switch 22, sets a normally reset flip-flop 42 to place its output at C in a high state. This high state output at C is applied to the C input of AND-gates 44 and 46, whose outputs A and B respectively are applied to the control inputs of FET switches 48 and 50 respectively. The sampling rate clock $f_s$ at point 10c of spectrum analyzer 10 is fed over line 34 and through an amplifier 52 to a programmable frequency synthesizer comprising a phase lock loop 54 and a programmable divider 56 connected as shown in FIG. 2. Phase lock loop 54 comprises a network 54a, a loop filter 54b, and a voltage controlled oscillator 54c whose output is applied to a programmable divider 56. The outputs of this synthesizer are lines 28a and 28b, line 28a carrying a clock pulse train at $2f_s$, and line 28b carrying a clock train at a substantially higher frequency $f_m$, up to 100 MHz or higher, limited primarily by the clocking-in capability of storage device 14. The rate of the clock on line 28b is programmable and can be set to the desired sampling rate for a particular fast signal at buffer amplifier 12, for example by suitable manual controls (not shown) of divider 56. A feedback output of divider 56 is applied to network 54a to synchronize the clocks on lines 28a and 28b with the clock at $f_s$. The output of network 54a thus depends on any phase shift between clock $f_s$ and the output of VCO 54e, and controls VCO 54c to speed up or slow down as needed to keep the clocks on lines 28a and 28b coherent with the clock at $f_s$. divider 56 may be, for example, a series of flip-flops dividing the output of VCO 54c, which operates at a substantially higher rate than $f_s$.

The two clocks on lines 28a and 28b are fed to FET analog switches 50 and 48 respectively, whose gates are driven from AND-gates 46 and 44 respectively. AND-gates 44 and 46 are in turn driven on one input from trigger flip-flop 42, which is set when triggered, and on the other input from flip-flop 58, with the Q output of flip-flop 58 going to AND-gate 46 and with the $\overline{Q}$ output of flip-flop 58 going to AND-gate 44. In the absence of an input trigger from switch 22, trigger flip-flop 42 is in the reset condition, and AND-gates 44 and 46 have low outputs which cut off FET switches 48 and 50, thereby isolating the clocks on lines 28a and 28b from binary counters 60 and 62. Flip-flop 58 is also normally in a reset condition, with its $\overline{Q}$ output at a high state. Flip-flop 58 is reset either manually, through a momentary manual switch 64, or is reset by counter 60 when that counter 60 reaches a count of 512. Switch 64 and the output of counter 60 are connected to the reset input of flip-flop 58 through and OR-gate 66.

In operation, when a trigger pulse is applied to flip-flop 42 through switch 22, trigger flip-flop 42 is set, thereby raising one input of each of AND-gates 44 and 46. Since flip-flop 58 is normally in the reset condition, the output of AND-gate 44 changes to a high state at this time, while the output of AND-gate 46 remains in a low state. The high state output of AND-gate 44 turns on FET switch 48, while the low state output of AND-gate 46 keeps FET switch 50 open. Now clock pulses at the high frequency $f_m$ present on line 28b are applied to binary counter 62 through FET switch 48. These same high rate clock pulses are applied through an OR-gate 68 to clock driver 16, to clock-in the fast input signal at the output of buffer amplifier 12 into storage device 14 at the high rate determined by divider 56. When counter 62 has counted 512 fast clock pulses (which means that 256 fast analog samples have been stored in storage 14), it provides an output on line 62a which sets flip-flop 58, and the set state of flip-flop 58 opens AND-gate 46 and closes AND-gate 44. The same output on line 62a is applied over line 32 to external trigger point 10b of spectrum analyzer 10 to externally trigger it. When AND-gates 44 and 46 reverse states, FET switch 48 is turned off and FET switch 50 is turned on. Now the pulses on line 28a, at $2f_s$, are applied to counter 60 through FET switch 50 and are also applied to clock driver 16 through OR-gate 68. Additionally, since the output of AND-gate 46 is at a high state, it resets binary counter 62. Note that counter 60 has been reset, at the trigger pulse, by the high state output of AND-gate 44. When binary counter 60 counts 512 clock pulses (which means that all 256 fast analog samples have been read out of storage 14), its output resets both trigger flip-flop 42 and flip-flop 58 through OR-gate 66, thus opening both FET switches 48 and 50 to prevent any further clock pulses from entering clock driver 16 until the next trigger pulse from switch 22.

Storage device 14 has 512 stages, and can therefore store 256 fast analog samples. When clock driver 16 first starts clocking storage device 14 at the fast rate $f_m$, the 512 fast rate pulses clock into it 256 fast analog samples of the fast input signal present at the output of buffer amplifier 12. Then, the next 512 pulses clock these 256 fast analog samples out of storage device 14 and into signal point 10a of spectrum analyzer 10, through buffer amplifier 70 and line 30, at the normal sampling rate $f_s$ of spectrum analyzer 10. Note that spectrum analyzer 10 is triggered over line 32 at the time it starts receiving fast analog samples from storage device 14.

By changing the setting of programmable divider 56, e.g., by selecting for $f_m$ the output of a different one of the flip-flops that may be a part of it, any suitable fast sampling rate can be provided, up to the limitation imposed by the characteristics of storage device 14, provided VCO 54e is at a high enough frequency. Periodic samples of a fast input signal at buffer amplifier 12 can be obtained by periodically triggering the external trigger at line 36, or by looking at a periodic fast input signal by suitably setting threshold adjuster 28.

While the term "transient" signal has been used interchangeably with the term "fast signal", it should be clear that both terms denote a signal whose duration is short as compared to the normal sampling rate $f_s$ of spectrum analyzer 10, whether this short duration signal be a transient signal or a short portion of any other signal. Additionally, while a charge coupled device (for example, a device of the type discussed in Yearbook of Science and Technology, 1972, McGraw-Hill, pages 143–144) has been used as storage device 14, it should be clear that any other storage device having comparable characteristics can be used. For example 256 discrete capacitors can be used, with fast analog samples gated into these capacitors at the high rate $f_m$ by a combination of a counter and analog gates, and with the samples read out of these discrete capacitors at the lower rate $f_s$ by a combination of a second counter and a second set of analog gates.

In summary, the gist of the invention is that it enables a conventional, relatively inexpensive spectrum analyzer to analyze signals which are so short in comparison to the normal sampling clock of the spectrum analyzer that they can not be otherwise analyzed. This is done by sampling the short duration signal at a rate which is substantially higher than the normal sampling rate of the spectrum analyzer, for example, at least four times higher, and typically at least an order of magnitude higher, storing these analog samples in analog form, rather than converting them to digital form, and then reading out the stored analog samples at a rate comparable to the normal sampling rate of the spectrum analyzer, so that the resulting signal can be analyzed in any of the conventional modes of the spectrum analyzer.

I claim:

1. A spectrum analyzer having a selected first sampling rate and comprising:
   means for receiving a fast analog signal whose duration of interest is short as compared with said first sampling rate of the spectrum analyzer;
   means for providing a second sampling rate which is substantially higher than said first sampling rate;
   means for sampling the fast analog signal at said second sampling rate to provide a succession of fast analog samples of said fast analog signal at said second sampling rate;
   analog signal storage means for storing in succession the fast analog samples provided by the sampling means, said storage means including an input for analog samples to be stored therein and an output for analog samples to be read therefrom and having means for shifting all fast analog samples stored therein toward the output for the storing of a new fast analog sample applied to the input;
   means for reading the fast analog samples from the storage means at a reading sampling rate which is the same as and synchronous with the first sampling rate to provide a succession of slow analog samples, said reading means including means for shifting all fast analog samples stored in the storage means toward the output for the reading out of a fast analog sample;
   means for analyzing analog samples occurring at said first sampling rate to derive signals indicative of the frequency content or power spectrum of the corresponding analog signal; and
   means for applying the slow analog samples read out of the storing means to said analyzing means at said first sampling rate.

2. A spectrum analysis method comprising the steps of:
   receiving a fast analog signal whose duration of interest is short as compared with a first sampling rate;
   providing a second sampling rate which is substantially higher than said first sampling rate;
   sampling a fast analog signal at said second sampling rate to provide a succession of fast analog samples of the fast analog signal at said second sampling rate;
   storing in succession the fast analog samples in a storage device including an input for analog samples to be stored therein and an output for analog samples to be read therefrom, including shifting all fast analog samples stored therein toward the output for the storing of a new fast analog sample applied to the input;
   reading the fast analog samples from the storage device at a reading sampling rate which is the same as and synchronous with the first sampling rate to provide a succession of slow analog samples, including shifting all fast analog samples stored in the storage device toward the output for the reading out of a fast analog sample, and
   analyzing the slow analog samples occurring at said first sampling rate with a spectrum analyzer having a sampling frequency clock operating at a sampling frequency which is the same as and synchronous with said first sampling rate to derive signals indicative of the frequency content or power spectrum of the analog signal made up by said slow analog samples.

3. A spectrum analyzer as in claim 1 wherein said second sampling rate is at least four times higher than the first sampling rate.

4. A spectrum analyzer as in claim 3 wherein the storing means comprises a charge coupled device serving as an analog delay line and the reading means include means for reading out the contents of the charge coupled device.

5. A spectrum analyzer as in claim 1 wherein the storing means comprises a charge coupled device serving as an analog delay line.

6. A method as in claim 2 wherein said second sampling rate is at least four times higher than the first sampling rate.

7. A method as in claim 6 wherein the storing step includes storing the fast analog samples, at said second sampling rate, in a charge coupled device serving as an analog delay line.

8. A method as in claim 2 wherein the storing steps include the step of storing the fast analog samples in a charge coupled device serving as an analog delay line and the reading step includes the step of reading the fast analog samples stored in the charge coupled device.

9. A spectrum analyzer as in claim 5, wherein the charge-coupled device has a selected capacity, the storing means include means for providing a trigger signal and means responsive to the trigger signal to cause storing said succession of fast analog samples in the charge-coupled device at said second sampling rate until the charge-coupled device is filled to capacity, and the reading means include means responsive to the charge-coupled device being filled to capacity to cause reading the stored fast analog samples at said reading sampling rate.

10. A spectrum analyzer as in claim 1, wherein the means for sampling the fast analog signal and for storing the succession of fast analog samples in the storing means comprise a charge-coupled device receiving said fast analog at its input and clocked at said second sampling rate to store an analog sample representing the instantaneous value of the fast analog signal applied to its input during each period of said second sampling rate, and wherein the means for reading the stored fast analog samples comprise means for clocking the charge-coupled device at said reading sampling rate to read out the samples stored in the charge-coupled device.

11. A spectrum analyzer as in claim 10, wherein the charge-coupled device has a selected capacity, the storing means include means for generating a trigger signal and means responsive to said trigger signal for applying clock pulses at said second sampling rate to the charge-coupled device to thereby store said fast analog samples therein, and the reading means include means responsive to the charge-coupled device being filled to capacity with said fast analog samples for discontinuing the clocking of the charge-coupled device at the second sampling rate and for clocking the charge-coupled device at said reading sampling rate until the charge-coupled device is empty.

* * * * *